(12) United States Patent
Merems et al.

(10) Patent No.: US 11,034,068 B2
(45) Date of Patent: Jun. 15, 2021

(54) ENCAPSULATING ELECTRONICS IN HIGH-PERFORMANCE THERMOPLASTICS

(71) Applicant: RAYTHEON COMPANY, Waltham, MA (US)

(72) Inventors: Paul A. Merems, Tucson, AZ (US); Darin M. Gritters, Yucaipa, CA (US)

(73) Assignee: RAYTHEON COMPANY, Waltham, MA (US)

( * ) Notice: Subject to any disclaimer, the term of this patent is extended or adjusted under 35 U.S.C. 154(b) by 323 days.

(21) Appl. No.: 15/966,950

(22) Filed: Apr. 30, 2018

(65) Prior Publication Data
US 2019/0329468 A1    Oct. 31, 2019

(51) Int. Cl.

| | | |
|---|---|---|
| *B29C 45/14* | (2006.01) | |
| *H05K 1/18* | (2006.01) | |
| *B29C 39/10* | (2006.01) | |
| *G01D 11/24* | (2006.01) | |
| *B29K 101/10* | (2006.01) | |
| *B29K 101/12* | (2006.01) | |
| *B29L 31/34* | (2006.01) | |

(52) U.S. Cl.
CPC ........ *B29C 45/14819* (2013.01); *B29C 39/10* (2013.01); *G01D 11/245* (2013.01); *B29K 2101/10* (2013.01); *B29K 2101/12* (2013.01); *B29L 2031/34* (2013.01)

(58) Field of Classification Search
CPC .. H05K 9/00; H05K 5/06; H05K 1/00; H05K 1/02; H05K 1/16; H05K 1/14; H05K 1/18; H01L 23/02; H01L 23/28; H01L 23/31; H01L 23/48; H01L 23/3135; H01L 23/552; B29C 45/14; B29C 45/14819; B29C 30/10

USPC ........ 361/736–752, 792–795; 257/685–730, 257/787–790
See application file for complete search history.

(56) References Cited

U.S. PATENT DOCUMENTS 4,961,893 A    10/1990  Rose
5,394,304 A *  2/1995  Jones ...................... B65B 53/02
                                                        174/256
(Continued)

FOREIGN PATENT DOCUMENTS

GB    2268427 A    1/1994
GB    2340666 A    2/2000

OTHER PUBLICATIONS

International Search Report Application No. PCT/US2019/019109; dated Oct. 21, 2019; pp. 5.
Written Opinion. PCT/US2019/019109; dated Oct. 21, 2019; pp. 6.

*Primary Examiner* — Tuan T Dinh
(74) *Attorney, Agent, or Firm* — Cantor Colburn LLP

(57) ABSTRACT

An encapsulation for electronics is provided. The encapsulation includes a circuit card assembly (CCA) on which a component of the electronics is operably disposed, a compliant thermal buffer coating (TBC), thermoset material and high-performance thermoplastic materials. The compliant TBC is layered over the component and a first area of the CCA, which extends about a periphery of the component. The thermoset material is cast over the compliant TBC and a second area of the CCA, which extends about a periphery of the compliant TBC. The high-performance thermoplastic material is injection molded over the thermoset material and a third area of the CCA, which extends about a periphery of the thermoset material.

14 Claims, 5 Drawing Sheets

(56) References Cited

U.S. PATENT DOCUMENTS

| | | | |
|---|---|---|---|
| 5,399,847 A | 3/1995 | Droz | |
| 5,417,905 A | 5/1995 | Lemaire et al. | |
| 5,420,757 A | 5/1995 | Eberhardt et al. | |
| 5,439,849 A * | 8/1995 | McBride | B32B 7/12 |
| | | | 428/310.5 |
| 5,557,064 A * | 9/1996 | Isern-Flecha | H05K 3/284 |
| | | | 174/378 |
| 5,600,181 A * | 2/1997 | Scott | H01L 23/31 |
| | | | 257/723 |
| 5,639,989 A * | 6/1997 | Higgins, III | H01L 23/552 |
| | | | 174/386 |
| 5,907,477 A | 5/1999 | Tuttle et al. | |
| 5,998,867 A * | 12/1999 | Jensen | H01L 23/3135 |
| | | | 174/104 |
| 6,256,873 B1 | 7/2001 | Tiffany, III | |
| 6,492,194 B1 * | 12/2002 | Bureau | H01L 21/56 |
| | | | 257/E21.502 |
| 6,605,404 B2 | 8/2003 | VanDusent et al. | |
| 7,897,881 B2 * | 3/2011 | Kaspar | H01L 23/3735 |
| | | | 174/382 |
| 8,376,268 B1 * | 2/2013 | Otto | B64C 29/0066 |
| | | | 244/12.5 |
| 8,603,709 B2 | 12/2013 | Wu | |
| 8,642,170 B2 | 2/2014 | Ivkovich et al. | |
| 8,754,167 B2 | 6/2014 | Hayashi et al. | |
| 8,765,342 B2 | 7/2014 | Wu | |
| 9,799,854 B2 * | 10/2017 | Ramadas | H01L 51/5256 |
| 2004/0020673 A1 * | 2/2004 | Mazurkiewicz | H01L 23/552 |
| | | | 174/250 |
| 2004/0262782 A1 | 12/2004 | Ellis et al. | |
| 2006/0152913 A1 * | 7/2006 | Richey | H05K 9/0024 |
| | | | 361/818 |
| 2009/0280314 A1 * | 11/2009 | Mahler | B32B 7/12 |
| | | | 428/310.5 |
| 2010/0140673 A1 * | 6/2010 | Daniel | H05K 1/0221 |
| | | | 257/288 |
| 2013/0330498 A1 * | 12/2013 | Hogg | H05K 3/284 |
| | | | 428/76 |

* cited by examiner

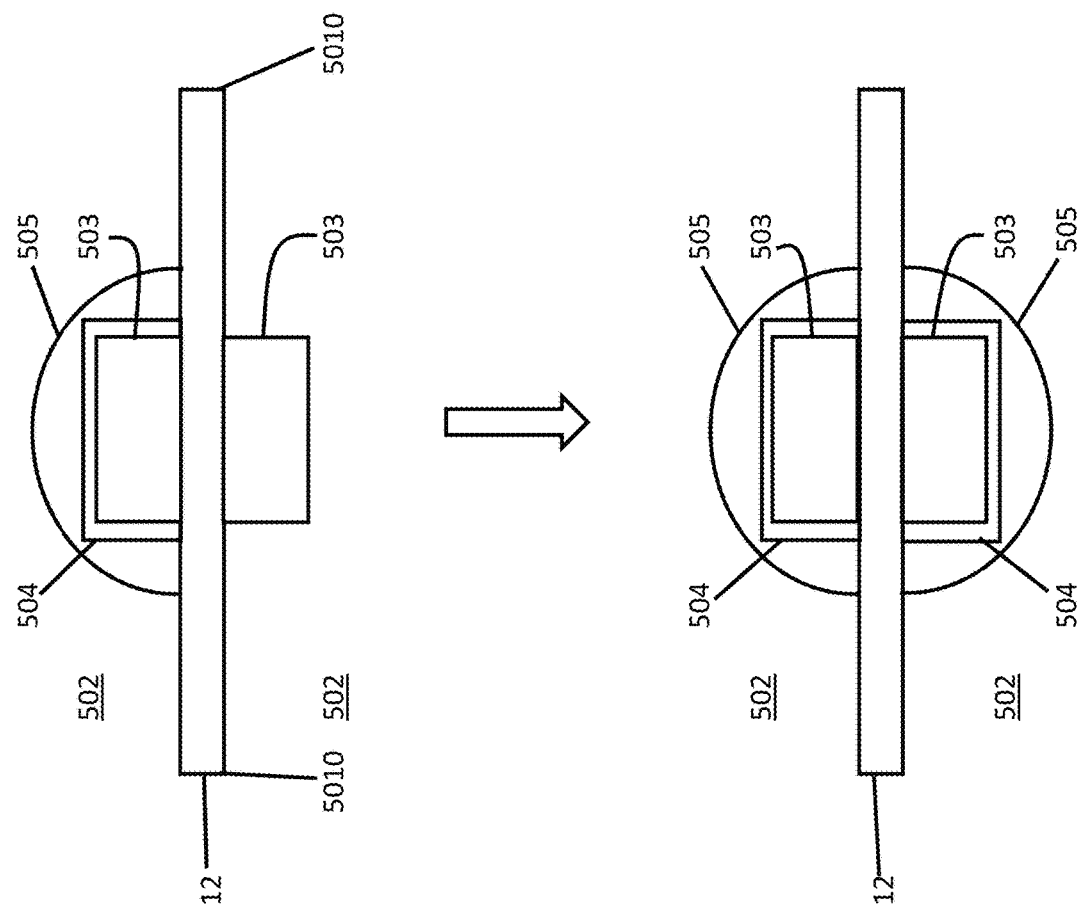

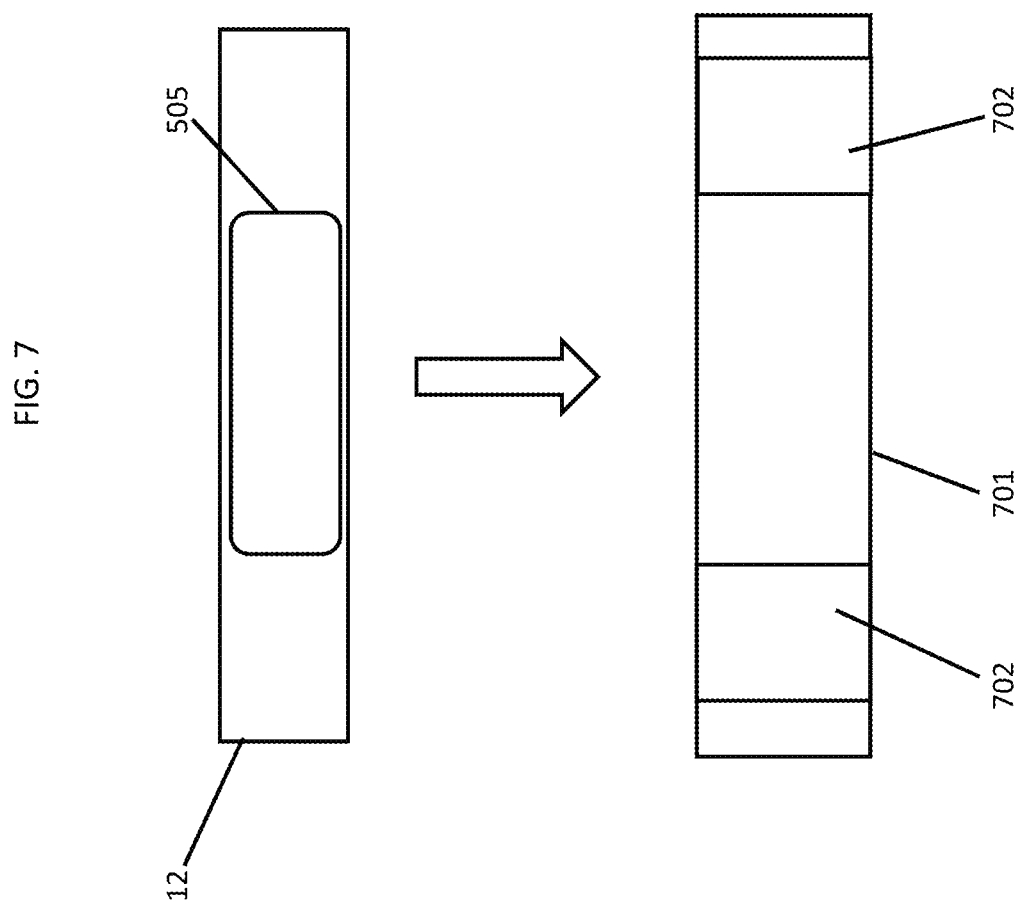

ENCAPSULATING ELECTRONICS IN HIGH-PERFORMANCE THERMOPLASTICS

GOVERNMENT LICENSE RIGHTS

This invention was made with government support under contract number HR0011-15-C-0081 awarded by The United States Department of Defense. The government has certain rights in the invention.

BACKGROUND

The present disclosure relates to encapsulation methods and, more particularly, methods of encapsulating electronics in high-performance thermoplastics.

In certain technologies, there often a need to embed electronics in a high-strength encapsulation when those electronics are at risk of exposure to the environment, flight loads or radio frequency/infrared (RF/IR) radiation. In these cases, low-strength injection molded thermoplastics or thermoset materials are incapable of providing the strength required to protect the electronics. On the other hand, while high-performance and high-strength thermoplastics (e.g., ULTEM, PEEK, LCP, etc.) can provide protection, direct exposure of the electronics to their high melting temperatures of +500° F. and high injection molding temperatures of +7,500 psi during injection molding processes can lead to damage of the electronics and de-solder incidents. Additionally, the coefficient of thermal expansion (CTE) mismatch between electronics components and moldings formed from high-performance and high-strength thermoplastics can cause stress on the components and lead to failures.

SUMMARY

According to one embodiment, an encapsulation for electronics is provided. The encapsulation includes a circuit card assembly (CCA) on which a component of the electronics is operably disposed, a compliant thermal buffer coating (TBC), thermoset material and high-performance thermoplastic materials. The compliant TBC is layered over the component and a first area of the CCA, which extends about a periphery of the component. The thermoset material is cast over the compliant TBC and a second area of the CCA, which extends about a periphery of the compliant TBC. The high-performance thermoplastic material is injection molded over the thermoset material and a third area of the CCA, which extends about a periphery of the thermoset material.

According to another embodiment, a sensor is provided and includes a CCA defining sectors, electronic components operably disposed on the CCA in each sector, a compliant thermal buffer coating (TBC), thermoset material and high-performance thermoplastic material. The compliant TBC is layered over each of the electronic components and first areas of the CCA, which extend about respective peripheries of the electronic components, in each sector. The thermoset material is cast over the compliant TBC and second areas of the CCA, which extend about respective peripheries of the compliant TBC, in each sector. The high-performance thermoplastic material is injection molded over the thermoset material and third areas of the CCA, which extend about respective peripheries of the thermoset material, in each sector.

According to yet another embodiment, a method of forming an encapsulation for a component of electronics operably disposed on a circuit card assembly (CCA) is provided. The method includes layering a compliant thermal buffer coating (TBC) over the component and a first area of the CCA, which extends about a periphery of the component, casting thermoset material over the compliant TBC and a second area of the CCA, which extends about a periphery of the compliant TBC and injection molding high-performance thermoplastic material over the thermoset material and a third area of the CCA, which extends about a periphery of the thermoset material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 6 is an illustration of further operations of the method of FIG. 4 in accordance with embodiments; and FIG. 7 is an illustration of late steps of the method of FIG. 4 in accordance with embodiments.

DETAILED DESCRIPTION

Electronics often need to be encapsulated in high-strength encapsulating materials to protect the electronics from exposure to environmental conditions, flight loads or transmitted radiation requirements in missile and projectile applications. Using low-strength injection molded thermoplastics or thermosets for such encapsulations does not typically provide the strength needed to fully protect the electronics. On the other hand, while high-performance and high-strength thermoplastics (e.g., ULTEM, PEEK, LCP, etc.) can provide the needed strength for protection, they tend to have characteristically high melting temperatures of at least 500° F. and characteristically high injection molding pressures of at least 7,500 psi.

Thus, when such high-performance thermoplastic materials are used to encapsulate electronics, the electronics can be directly exposed to relatively high temperatures and pressures to the extent that the electronics are damaged or subject to de-solder incidents. Additionally, since the electronics and the high-performance thermoplastics tend to have varying coefficients of thermal expansion (CTEs), the CTE mismatch can cause component stresses and failures.

Therefore, as will be described below, electronics components are encapsulated with compliant thermal buffer coating (TBC), a thermoset material and a high-performance thermoplastic material. The compliant TBC is applied directly to exposed electronic components on a circuit card assembly (CCA). The thermoset material, which is characterized as having a relatively low melting temperature and relatively high compressive strength, is cast over the compliant TBC. The cast thermoset material can be coated with compliant TBC as well. The high-performance thermoplastic material is then injection molded over the cast thermoset material.

The compliant TBC provides a thermal buffer to protect the electronic components from high injection molding temperatures and a compliant buffer for addressing CTE mismatch stresses. The cast thermoset material provides protection from the relatively high molding pressures associated with the injection molding of the high-performance thermoplastic material and some thermal protection. The cast thermoset material also provides a uniform surface for the injection molded thermoplastic material to improve uniform injection flows.

Figure 1:
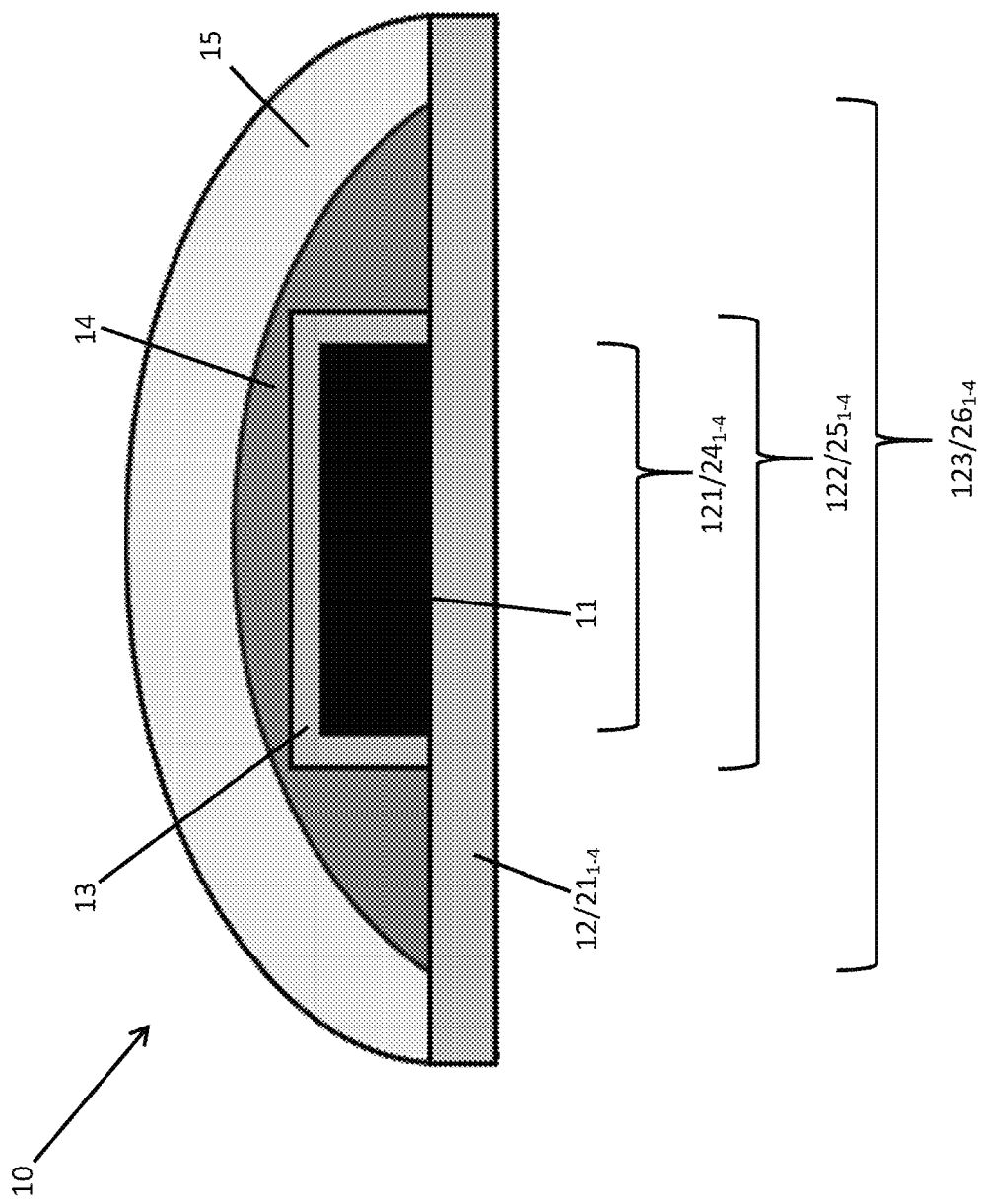
FIG. 1 is an elevational schematic view of an encapsulation formed about electronics in accordance with embodiments.

With reference to FIG. 1, an encapsulation 10 is provided for a component 11 of electronics. The electronics can be any type of electronics including, for example, electronics normally associated with a sensor of a missile or a projectile. The encapsulation 10 includes a CCA 12 on which the component 11 of the electronics is operably disposed, a compliant TBC 13, thermoset material 14 and high-performance thermoplastic material 15. The compliant TBC 13 is layered over the component 11 and a first area 12$_1$ of the CCA 12. The first area 12$_1$ extends about a periphery of the component 11. The thermoset material 14 is cast over the compliant TBC 13 and a second area 12$_2$ of the CCA 12. The second area 12$_2$ extends about a periphery of the compliant TBC 13. The high-performance thermoplastic material 15 is injection molded over the thermoset material 14 and a third area 12$_3$ of the CCA 12. The third area 12$_3$ extends about a periphery of the thermoset material 14.

In accordance with embodiments, the compliant TBC 13 may include rubberized material that can be painted or brushed over or onto exterior surfaces of the component 11 of the electronics and over or onto supper surfaces of the CCA 12 in the first area 12$_1$. The compliant TBC 13 provides for compliance between the component 11 and the thermoset material 14 and particularly provides for CTE mismatch compliance between the component 11 and the thermoset material 14. The thermoset material 14 may be provided as a thermoset material with a characteristically low curing temperature and a characteristically high compressive strength. The high-performance thermoplastic material 15 can be provided as a thermoplastic material with a characteristically high melting temperature of at least 500° F. and a characteristically high injection molding pressure of at least 7,500 psi.

Figure 3:
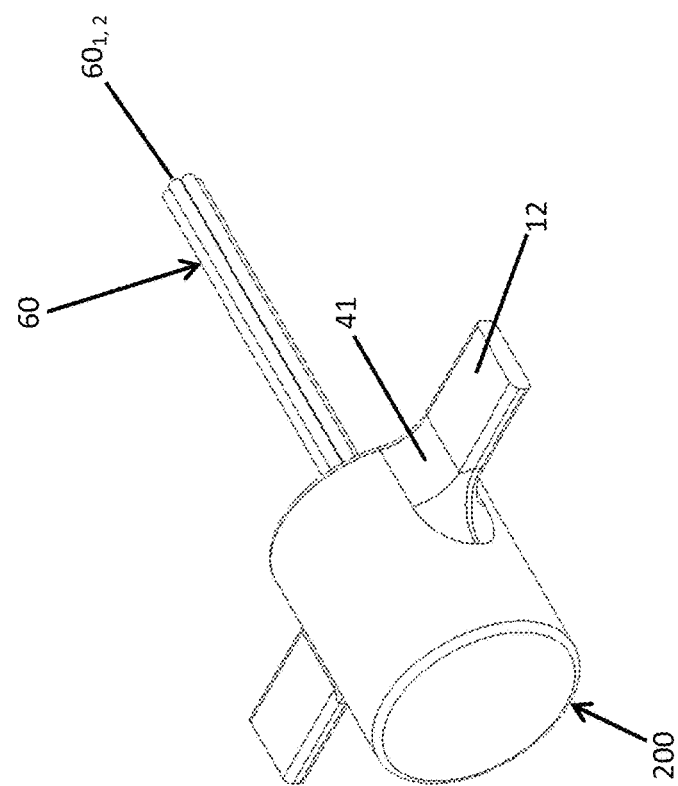
FIG. 3 is a perspective view of the sensor of FIG. 2.
Figure 2:
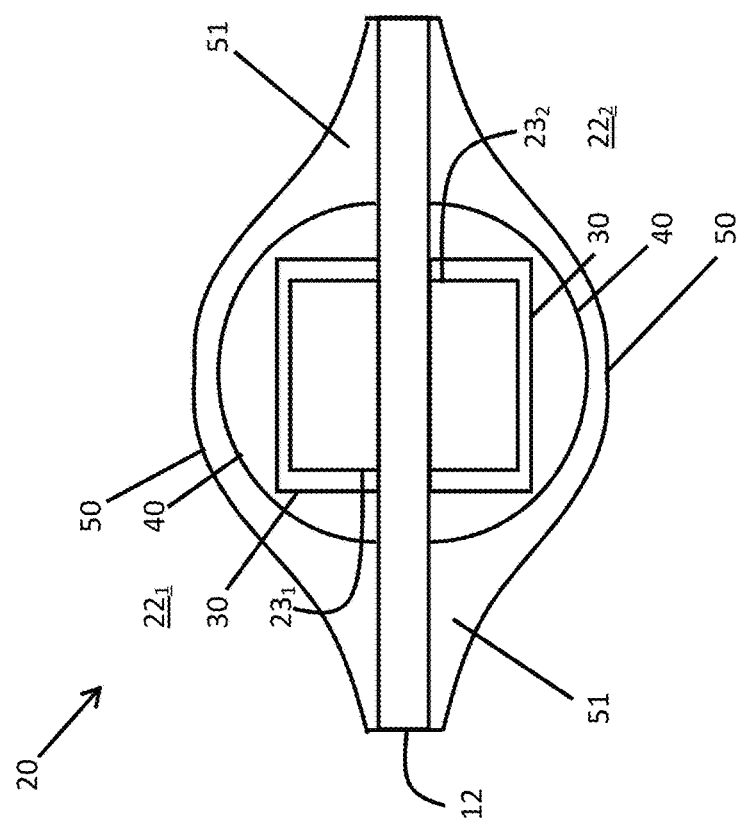
FIG. 2 is an axial view of encapsulated electronics of a sensor in accordance with embodiments.

With reference to FIGS. 2 and 3, the encapsulation 10 of FIG. 1 may be provided, for example, as an encapsulation 20 of or for a sensor 200 (see FIG. 3) for use in a missile, a projectile or another similar device. In such cases, the CCA 12 defines sectors 22$_1$ and 22$_2$ and the component 11 is provided as a number of electronic components 23$_1$ and 23$_2$. As shown in FIG. 2, each of the electronic components 23$_1$ and 23$_2$ is operably disposed on the CCA 12 in one of the sectors 22$_1$ and 22$_2$.

It is to be understood that, while the numbers of the sectors 22$_1$ and 22$_2$ and the electronic components 23$_1$ and 23$_2$ are two in FIGS. 2 and 3, embodiments with fewer or greater numbers of each are possible. In addition, the numbers of each need not match (e.g., CCA 12 can have zero electronic components operably disposed thereon in sector 22$_1$ and two electronic components operably disposed thereon in sector 22$_2$). For purposes of clarity and brevity, however, the following description will relate to the case illustrated in FIGS. 2 and 3.

As shown in FIGS. 2 and 3, the encapsulation 20 of sensor 200 includes compliant TBC 30, thermoset material 40, high-performance thermoplastic material 50 and wiring 60 (see FIG. 3). The compliant TBC 30, the thermoset material 40 and the high-performance thermoplastic material 50 are similar to the materials described above in terms of the characteristics and functions of each. The wiring 60 may be provided as a single wiring member or as individual wiring members 60$_1$ and 60$_2$ that respectively extend from the electronic components 23$_1$ and 23$_2$ and through the compliant TBC 30, the thermoset material 40 and the high-performance thermoplastic material 50.

The compliant TBC 30 is layered over the electronic component 23$_1$ and first area 24$_1$ (see FIG. 1) of the CCA 12 in sector 22$_1$. First area 24$_1$ extends about the periphery of the component 23$_1$. The compliant TBC 30 is layered over the electronic component 23$_2$ and first area 24$_2$ (see FIG. 1) of the CCA 12 in sector 22$_2$.

In sector 22$_1$, the thermoset material 40 is cast over the compliant TBC 30 and second area 25$_1$ (see FIG. 1) of the CCA 12, which extends about the periphery of the compliant TBC 30. In sector 22$_2$, the thermoset material 40 is cast over the compliant TBC 30 and second area 25$_2$ (see FIG. 1) of the CCA 12, which extends about the periphery of the compliant TBC 30.

In sector 22$_1$, the high-performance thermoplastic material 50 is injection molded over the thermoset material 40 and third area 26$_1$ (see FIG. 1) of the CCA 12, which extends about the periphery of the thermoset material 40. In sector 22$_2$, the high-performance thermoplastic material 50 is injection molded over the thermoset material 40 and third area 26$_2$ (see FIG. 1) of the CCA 12, which extends about the periphery of the thermoset material 40.

In accordance with further embodiments and, as shown in FIG. 3, the high-performance thermoplastic material 50 is injection molded to form fillets 51 along portions of the CCA 12 in each sector 22$_1$ and 22$_2$. The fillets 51 smoothly extend about the CCA 12 and are tapered to exhibit decreasing thickness along the CCA 12 with increasing radial distance from a center of the encapsulation 20.

Figure 4:
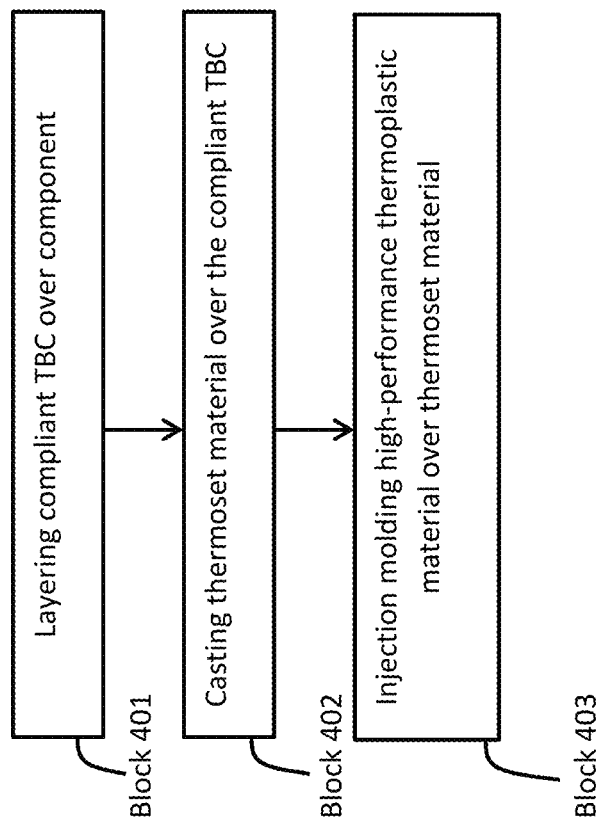
FIG. 4 is a flow diagram illustrating a method of encapsulating electronics in accordance with embodiments.

With reference to FIG. 4, a method of forming an encapsulation for a component of electronics, where the component is operably disposed on a CCA (as described above) is provided. The method includes layering compliant TBC over the component and a first area of the CCA, which extends about a periphery of the component (block 401), casting thermoset material over the compliant TBC and a second area of the CCA, which extends about a periphery of the compliant TBC (block 402) and injection molding high-performance thermoplastic material over the thermoset material and a third area of the CCA, which extends about a periphery of the thermoset material (block 404).

Further details of the method of FIG. 4 will now be described with reference to FIG. 5-7.

Figure 5:
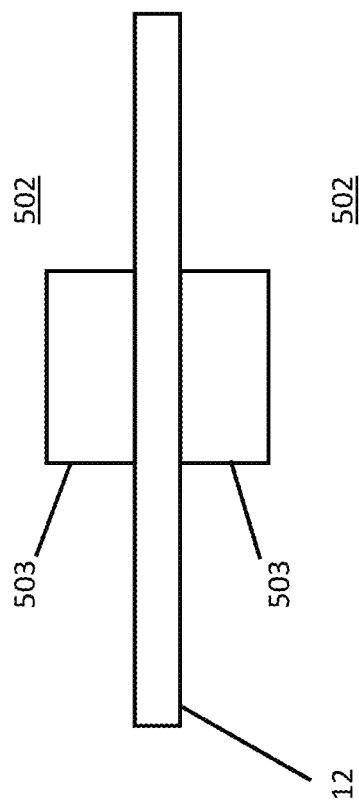
FIG. 5 is an illustration of operations of the method of FIG. 4 in accordance with embodiments.

As shown in FIG. 5, the method may include arranging the CCA 12 to define sectors 502 and providing the electronic components as electronic components 503 that are each operably disposed on the CCA 12 in each sector 502.

As shown in FIG. 6, the method may also include supporting the CCA 12 such that one sector 502 faces upwardly, completing the layering and the curing of the compliant TBC to form TBC layer 504, completing the casting and the curing of the thermoset material to form thermoset material layer 505 in the one sector 502 facing upwardly and rotating the CCA 12 such that a next sector 502 faces upwardly.

In accordance with embodiments, the supporting of the CCA 12 may include supporting the CCA 12 at tips 5010 thereof. As such, subsequent operations and processes may not be applied to the respective tips 5010 with the resulting structure having the respective tips 5010 in an exposed condition.

The method then includes completing the layering and the curing of the compliant TBC to form compliant TBC layer 504, completing the casting and the curing of the thermoset material to form thermoset material layer 505 in the next sector 502 facing upwardly.

As shown in FIG. 7, the method may also include forming a mold 701 and completing the injection molding of the high-performance thermoplastic material in each sector 502 simultaneously in the mold 701. In accordance with embodiments, the forming of the mold 701 may include forming fillet molding portions 702 as described above in each sector 502.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An encapsulation for electronics, comprising:
a circuit card assembly (CCA) on which a component of the electronics is operably disposed;
a compliant thermal buffer coating (TBC) layered over the component and a first area of the CCA, which extends about a periphery of the component;
a thermoset material cast over the compliant TBC and a second area of the CCA, which extends about a periphery of the compliant TBC; and
a high-performance thermoplastic material injection molded over the thermoset material and a third area of the CCA, which extends about a periphery of the thermoset material, wherein the high-performance thermoplastic material is injection molded to form fillets that are tapered to exhibit decreased thickness with increasing distance from an encapsulation center.

2. The encapsulation for electronics according to claim 1, wherein:
the compliant TBC comprises rubberized material and provides for coefficient of thermal (CTE) mismatch compliance between the component and the thermoset material,
the thermoset material comprises a low-temperature, high-compressive strength thermoset material, and
the high-performance thermoplastic material comprises a high-performance thermoplastic that has a melting temperature of at least 500° F. and an injection molding pressure of at least 7,500 psi.

3. The encapsulation for electronics according to claim 1, wherein:
the CCA defines sectors at opposite sides of the CCA, and
the component is provided as a number of components, each of which is operably disposed on the CCA in one of the sectors at each of the opposite sides of the CCA.

4. The encapsulation for electronics according to claim 3, wherein the number of the sectors is two.

5. The encapsulation for electronics according to claim 3, wherein:
the compliant TBC is layered over each of the components and first areas of the CCA, which extend about respective peripheries of each of the components, in each sector at each of the opposite sides of the CCA,
the thermoset material is cast over the compliant TBC and second areas of the CCA, which extend about respective peripheries of the compliant TBC, in each sector at each of the opposite sides of the CCA, and
the high-performance thermoplastic material is injection molded over the thermoset material and third areas of the CCA, which extend about respective peripheries of the thermoset material, in each sector at each of the opposite sides of the CCA.

6. A sensor, comprising:
a CCA defining sectors at opposite sides of the CCA;
electronic components operably disposed on the CCA in each sector at each of the opposite sides of the CCA;
a compliant thermal buffer coating (TBC) layered over each of the electronic components and first areas of the CCA, which extend about respective peripheries of the electronic components, in each sector at each of the opposite sides of the CCA;
a thermoset material cast over the compliant TBC and second areas of the CCA, which extend about respective peripheries of the compliant TBC, in each sector at each of the opposite sides of the CCA; and
a high-performance thermoplastic material injection molded over the thermoset material and third areas of the CCA, which extend about respective peripheries of the thermoset material, in each sector at each of the opposite sides of the CCA, wherein the high-performance thermoplastic material is injection molded to form fillets that are tapered to exhibit decreased thickness with increasing distance from an encapsulation center.

7. The sensor according to claim 6, wherein:
the compliant TBC comprises rubberized material and provides for coefficient of thermal (CTE) mismatch compliance between the component and the thermoset material,
the thermoset material comprises a low-temperature, high-compressive strength thermoset material, and
the high-performance thermoplastic material comprises high-performance thermoplastic that has a melting temperature of at least 500° F. and an injection molding pressure of at least 7,500 psi.

8. A method of forming an encapsulation for a component of electronics operably disposed on a circuit card assembly (CCA), the method comprising:

layering a compliant thermal buffer coating (TBC) over the component and a first area of the CCA, which extends about a periphery of the component;

casting thermoset material over the compliant TBC and a second area of the CCA, which extends about a periphery of the compliant TBC;

forming a mold; and injection molding high-performance thermoplastic material in the mold over the thermoset material and a third area of the CCA, which extends about a periphery of the thermoset material, wherein the forming of the mold comprises forming fillet molding portions to form fillets of the high-performance thermoplastic material that are tapered to exhibit decreased thickness with increasing distance from an encapsulation center.

9. The method according to claim 8, wherein:

the compliant TBC comprises rubberized material and provides for coefficient of thermal (CTE) mismatch compliance between the component and the thermoset material, the thermoset material comprises a low-temperature, high-compressive strength thermoset material, and the high-performance thermoplastic material comprises high-performance thermoplastic that has a melting temperature of at least 500° F. and an injection molding pressure of at least 7,500 psi.

10. The method according to claim 8, further comprising:

arranging the CCA to define sectors at opposite sides of the CCA, and providing the component as a number of components, each of which is operably disposed on the CCA in each sector at each of the opposite sides of the CCA.

11. The method according to claim 10, further comprising:

supporting the CCA such that one sector at one of the opposite sides of the CCA faces upwardly;

completing the layering and the casting in the one sector at the one of the opposite sides of the CCA facing upwardly;

rotating the CCA such that a next sector at the other of the opposite sides of the CCA faces upwardly; and completing the layering and the casting in the next sector at the other of the opposite sides of the CCA facing upwardly.

12. The method according to claim 11, wherein the supporting comprises supporting the CCA at tips thereof.

13. The method according to claim 11, further comprising completing the injection molding in each sector at each of the opposite sides of the CCA simultaneously in the mold.

14. The method according to claim 13, wherein the forming of the mold comprises forming the fillet molding portions in each sector to form the fillets of the high-performance thermoplastic material.

* * * * *